US005478658A

United States Patent [19]
Dodabalapur et al.

[11] Patent Number: 5,478,658
[45] Date of Patent: Dec. 26, 1995

[54] ARTICLE COMPRISING A MICROCAVITY LIGHT SOURCE

[75] Inventors: Ananth Dodabalapur, Millington; Timothy M. Miller, New Providence; Lewis J. Rothberg, Morristown, all of N.J.

[73] Assignee: AT&T Corp., Murray Hill, N.J.

[21] Appl. No.: 246,439

[22] Filed: May 20, 1994

[51] Int. Cl.⁶ .............................. H05B 33/12; H01S 3/08
[52] U.S. Cl. ...................... 428/690; 428/917; 313/504; 372/92; 372/45; 372/39; 372/7; 372/69; 372/41; 372/6; 372/2; 372/44; 385/47; 385/131; 359/838
[58] Field of Search .................................. 428/690, 691, 428/917; 313/504; 372/92, 45, 39, 7, 69, 41, 6, 2, 44; 385/47, 131; 359/838

[56] References Cited

U.S. PATENT DOCUMENTS

| | | | |
|---|---|---|---|
| 5,306,385 | 4/1994 | Cho et al. | 156/610 |
| 5,363,398 | 11/1994 | Glass et al. | 372/92 |
| 5,369,657 | 11/1994 | Cho et al. | 372/39 |

OTHER PUBLICATIONS

"Physics and Device Applications of Optical Microcavities", by H. Yokoyama, *Science*, vol. 256, Apr. 3, 1992, pp. 66–70.
"Optical Processes in Microcavities", by Y. Yamamoto et al., *Physics Today*, Jun. 1993, pp. 66–73.
"Microcavity Effects in Organic Semiconductors", by A. Dodabalapur et al., *Applied Physics Letters*, vol. 64(19), May 9, 1994, pp. 2486–2488.
"Developers Continue to Refine Blue LED Technologies for Display Use", by K. Murata, *Display Devices*, 1992, pp. 47–50.
"White Light–Emitting Organic Electroluminescent Devices Using the Poly(N–vinylcarbaxole) Emitter Layer Doped With Three Fluorescent Dyes", by J. Kido et al., *Applied Physics Letters*, vol. 64(7), Feb. 14, 1994, pp. 814–817.
"Electroluminescence from Single Layer Molecularly Doped Polymer Films", by G. E. Johnson et al., *SPIE*, vol. 1910, pp. 6–14.
"Electroluminescence of Doped Organic Thin Films", by C. W. Tang et al., *Journal of Applied Physics*, vol. 65, No. 9, May 1, 1989, pp. 3610.
"Spontaneous Emission From Planar Microstructures", By D. G. Deppe et al., *Journal of Modern Optics*, vol. 41, No. 2, 1994, p. 325.

Primary Examiner—Charles R. Nold
Attorney, Agent, or Firm—Eugen E. Pacher

[57] ABSTRACT

Optical microcavities are potentially useful as light emitters for, e.g., flat panel displays. Such microcavities comprise a layer structure, including two spaced apart reflectors that define the cavity, with a layer of organic (electroluminescent) material disposed between the reflectors. We have discovered that a microcavity can simultaneously emit radiation of two or more predetermined colors such that the emission has a desired apparent color, exemplarily white. Emission of two or more colors requires that the effective optical length of the cavity is selected such that the cavity is a multimode cavity, with the wavelengths of two or more of the standing wave modes that are supported by the cavity lying within the emission region of the electroluminescence spectrum of the active material.

21 Claims, 3 Drawing Sheets

ARTICLE COMPRISING A MICROCAVITY LIGHT SOURCE

FIELD OF THE INVENTION

This invention pertains to microcavity light sources, and to articles (e.g., displays) that comprise such sources.

BACKGROUND OF THE INVENTION

Prior art optical microcavities are resonators that typically have at least one dimension (herein typically the effective optical length of the cavity) on the order of an optical wavelength. It has been recognized that such resonators not only are interesting for fundamental research purposes but also hold technological promise for constructing novel kinds of light emitting devices. See, for instance, H. Yokoyama, *Science*, Vol. 256, pp. 66–70, which inter alia discloses a microcavity structure that contains a dye solution. See also Y. Yamamoto et al., *Physics Today*, pp. 66–73, June 1993. Possible applications of such microresonator light emitting devices are, for instance, in the fields of flat panel displays, back lights, optical interconnects, optical fiber communications and LED printing.

U.S. patent application Ser. No. 08/156,217, filed by us on Nov. 22, 1993 now U.S. Pat. No. 5,405,710 and incorporated herein by reference, discloses an apparatus that comprises at least two microcavity light emitters that differ in their cavity length, such that the microcavities emit radiation of a first and a second wavelength, respectively. See also A. Dodabalapur et al., *Applied Physics Letters*, Vol. 64(19), p. 2486.

At least some technological fields require emission of light of a specified apparent color, e.g., white. Such emissions are typically achieved through mixing of the emission from two or more different types of LED. See, for instance, K. Murata, *Display Devices*, pp. 47–50, 1992. Alternatively they can be achieved by incorporation of fluorescent dyes of different color into an organic LED. See J. Kido et al., *Applied Physics Letters*, Vol. 64 (7), p. 815 (1994), and G. E. Johnson et al., *SPIE*, Vol. 1910, p. 6. Exemplarily, devices that emit white light would be of interest for, e.g., low voltage portable backlit displays.

Known devices that emit white light or other mixed colors are not entirely satisfactory for technological applications such as displays for lap-top computers. For instance, some prior art displays are typically difficult to manufacture, and others emit over a broad wavelength range, with only relatively small peaks at predetermined wavelengths superimposed on a broad continuum. See, for instance, FIG. 2 of J. Kido et al., op. cit. Thus, a light emitting device that can emit light of a predetermined apparent color, exemplarily substantially white, and that can be manufactured relatively easily and economically, would be of considerable interest. This application discloses such a device.

SUMMARY OF THE INVENTION

The invention is embodied in an article that comprises one or more multimode microcavity light emitters, with a given emitter adapted for simultaneous emission of radiation of two or more predetermined colors (e.g., blue and red), such that a desired apparent color results.

More specifically, the article comprises a layer structure on a major surface of a substrate body (e.g., a glass plate). The layer structure comprises spaced apart first and second reflector means and an active layer that comprises organic material capable of electroluminescence (e.g., 8-hydroxyquinoline aluminum, generally referred to as Alq; such material will be referred to as "EL" material), with at least a portion of the active layer disposed between the reflector means. The first and second reflector means define a microcavity of effective optical length L. The layer structure further comprises means that facilitate flowing a current through the active layer such that the microcavity can be caused to emit radiation.

Significantly, the effective optical length L of the cavity is selected such that the cavity is a multimode cavity that can be caused to simultaneously emit radiation of two or more predetermined colors.

By a "multimode" microcavity we mean herein a microcavity which simultaneously supports two or more standing wave modes of the cavity. In embodiments of the invention the wavelengths of the two or more modes will lie within the emission region of the EL spectrum of the EL material. Typically L is selected such that at least one of the modes is a third or higher order standing wave mode of the microcavity. Exemplarily, L is selected such that the 7th, 8th and 9th modes are simultaneously supported by the cavity.

Typical embodiments of the invention will comprise a multiplicity of emitter structures as described above. Although frequently all these multimode emitters will emit light of substantially the same apparent color, this is not necessarily so, and articles that comprise two or more species of the multimode emitter, or one or more species of the multimode emitter and one or more species of the prior art microcavity emitter, are contemplated.

Optionally the active layer can comprise, in addition to the organic EL material, one or more additional layers, e.g., an electron or hole transport layer and/or an electron or hole blocking layer, and/or a filler layer. The EL material will typically be a single layer, and typically consist of an emissive compound or a host material doped with an emitter species. In all cases, the emission spectrum of the EL material in a microcavity according to the invention is a function of the cavity length L, with the spectrum changing as L is varied. This inter alia distinguishes embodiments of the instant invention from the devices disclosed for instance by J. Kido et al. (op. cit.) in which the electroluminescence spectrum of the EL material has three peaks, due to the presence of three different dyes in the material, with the wavelengths of the peaks substantially determined by the nature of the dyes.

The figures are not intended to be to scale or proportionate.

DETAILED DESCRIPTION

Figure 1:
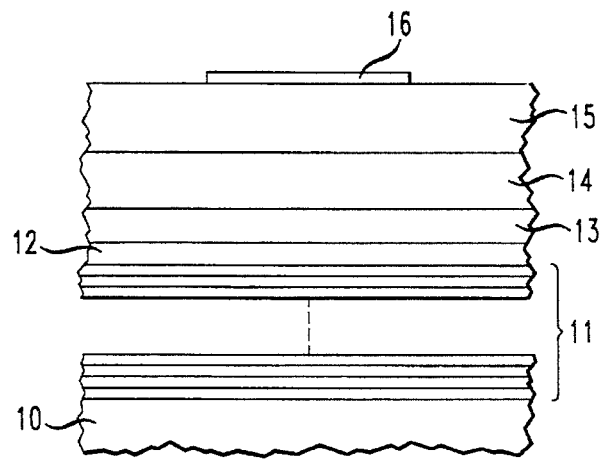
FIG. 1 schematically depicts the layer structure of an exemplary bottom-emitting microcavity according to the invention.

FIG. 1 schematically shows the layer structure associated with an exemplary single multimode microcavity according to the invention, wherein numeral 10 refers to the substrate, numerals 11–15 refer to the multilayer mirror, filler layer, transparent conductor, hole transport layer and EL layer, respectively. In a structure with a p-type emitter, layer 14 could be the EL layer, and 15 could be the electron transport layer. Optionally the structure can comprise an electron transport layer and a hole transport layer, with the EL layer sandwiched between the two transport layers. Numeral 16 refers to a portion or a patterned metal layer that serves as top electrode and as top reflector, and that defines the lateral extent of the microcavity. The lateral extent of region 16 will typically be much greater than (exemplarily at least 5 times) the effective optical length of the cavity.

In the bottom emitting configuration the substrate is substantially transparent to radiation of the relevant wavelengths. By "substantially transparent" we mean herein that, over the relevant distance, the attenuation of radiation of the relevant wavelengths is typically not more than 25%. Exemplary substrate materials are glass (including glass coated on one or both sides with a high refractive index material such as $TiO_2$), sapphire, quartz, or transparent plastic such as poly(ether sulfone).

The multilayer mirror consists of alternating layers of substantially non-absorbing materials of appropriately chosen thickness. Typically each layer is of thickness $\lambda/4$, where $\lambda$ is advantageously chosen to correspond approximately to the center wavelength of the EL emission spectrum, e.g., about 550 nm. Such mirrors are well known. The reflectivity of the mirror depends in a known way on the number of layer pairs, layer thickness and the refractive index of the materials used. Exemplary material pairs are $SiO_2$ and $SiN_x$, and $SiO_2$ and $TiO_2$.

The filler layer can be any substantially transparent material that is chemically stable under the manufacturing and operating conditions and that can be patterned by an appropriate technique. Exemplary filler materials are transparent polymers (e.g., a polyimide) or transparent inorganic dielectrics (e.g., $SiO_2$ or $Si_3N_4$).

The transparent (or semitransparent) conductor exemplarily is indium tin oxide (ITO) or a conducting polymer such as doped polyaniline, or a thin layer (e.g., about 10 nm) of metal (e.g., Au or Al), and may be unpatterned or patterned (e.g., into rows or columns).

The (optional) hole transport layer can be any substantially transparent material that can facilitate the transport of holes to the EL layer, where electron-hole recombination takes place. Examples of suitable materials are diamines (e.g., N, N'-diphenyl-N,N'-bis (3-methylphenyl)-1,1'-biphenyl-4,4'-diamine) and poly(phenylene vinylenes).

Exemplary EL materials are Alq, aromatic hydrocarbons, poly(phenylene vinylenes), oxadiazole and stilbene derivatives. The EL material optionally can be a stable non-emissive host material doped with an emissive material which has an energy gap that is less than that of the primary component of the EL material. Examples of such dopants are coumarins or 4-(dicyanomethylene)- 4H-pyrans in Alq. See, for instance, C. W. Tang et al., *J. Applied Physics*, Vol. 65, p. 3610 (1989). Such doping can be used for preliminary modification of the electroluminescence (EL) spectrum of the material and/or for enhancing the efficiency of the device. It will be understood that the emission region of the EL spectrum of the EL material must overlap the relevant cavity modes of the microcavity.

An (optional) electron transport layer (not shown in FIG. 1) can be any substantially transparent material that can facilitate electron transport from the relevant electrode to the EL layer. Exemplary of such materials are 2-(4-biphenyl)-5-phenyl-1,3,4-oxadiazole (PBD), butyl PBD, or either of these doped in an inert polymer such as poly(methyl methacrylate) (PMMA) or a poly(carbonate).

The metal layer serves to inject electrons into the adjacent layer, and can be a single layer or a multi-layer combination of metals. Exemplary low work function materials for use as metal contacts are Al, In, Mg, Ca, or alloys, e.g., MgAg.

Appropriate choice of EL material can make possible elimination of one (possibly both) of the hole transport layer and the electron transport layer. For instance, Alq can function both as EL material and electron transport medium, and poly(phenylene vinylene) can function both as EL material and hole transport medium.

It will be understood that it is possible to interchange the electron and hole injection contacts, such that electrons are injected from the transparent conductor layer and holes are injected from the patterned metal layer. If an electron transport layer and/or a hole transport layer are used, then their position in the layer structure is appropriately changed, e.g., interchanged.

Figure 2:
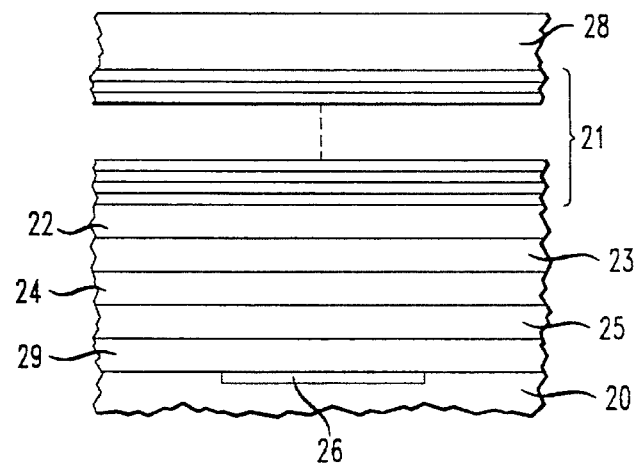
FIG. 2 schematically shows the layer structure of an exemplary top-emitting microcavity according to the invention.

Microcavities according to the invention can also be embodied in top-emitting structures. In such an emitter the substrate need not be transparent. It can be a metal (with an appropriate insulator provided) or a semiconductor, e.g., Si. FIG. 2 schematically shows an exemplary layer structure for a top-emitting microcavity, wherein numerals 20, 26 and 29 refer respectively to the substrate, the patterned metal layer and the (optional) electron transport layer, and numerals 25–21 refer, respectively, to the EL layer, (optional) hole transport layer, transparent conductor layer, (optional) filler layer, and multilayer mirror.

Some embodiments of the invention may also comprise a scattering layer that serves to randomize the emission over a large solid angle, thereby eliminating or at least reducing the angular dependence of the emission. This dependence, which is due to Fabry-Perot cavity effects, may be undesirable in some applications, e.g., for displays, and displays according to the invention may comprise such a layer. FIG. 2 illustrates a (top-emitting) embodiment that comprises scattering layer 28. In a bottom-emitting embodiment the scattering layer exemplarily is disposed between substrate and multi-layer mirror. Exemplarily, a scattering layer is a substantially transparent polymer (e.g., a polyimide or PMMA) with a colloidal dispersion (e.g., fumed silica) therein. It could also be a substantially transparent layer (e.g., $SiN_x$) with a mechanically rough surface.

An article according to the invention typically comprises, in addition to the above described multimode microcavity emitter or array of emitters, conventional components such as a power supply and drive circuitry. Any appropriate circuitry can be used to drive such a display. See, for instance, K. Murata, op. cit., which discloses at p. 49, FIG. 9 a matrix driving circuit which could be used in a display according to the invention. Exemplarily, the transparent conductor (e.g., 13) is a substantially uniform layer of lateral extent at least approximately equal to the size of the display, or it is patterned into strips, a given strip associated with a given row (or column) of the display.

Those skilled in the art will appreciate that embodiments of the invention typically will comprise one or more (e.g., dozens or even thousands) of multimode microcavities of a given effective optical length that can be caused to emit multicolor radiation.

Figure 3:
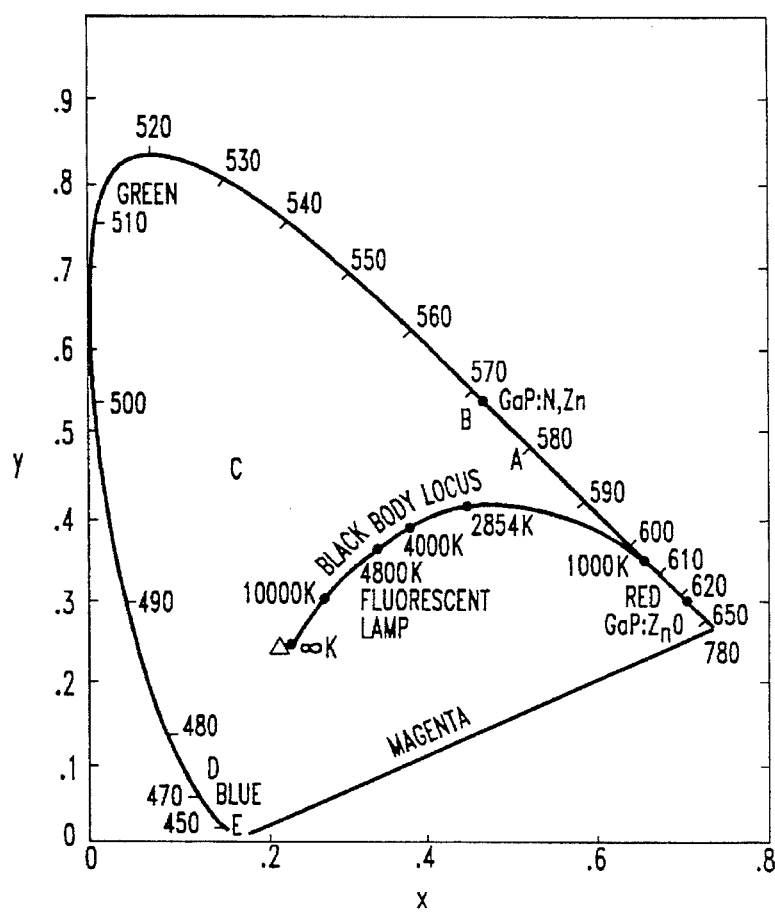
FIG. 3 shows the CIE chromaticity diagram.

It is well known that any apparent color can be produced by appropriate selection of the wavelength and intensity of two or more color components. See, for instance, FIG. 3, which shows the well known CIE chromaticity diagram. In the CIE formalism, the color of any light source can be expressed in terms of two coordinates x and y, the axes in FIG. 3. For instance, the "color" white has the coordinates x=0.33, y=0.33.

As stated above, a significant aspect of microcavity emitters according to the invention is selection of the optical thickness of the cavity such that the cavity is a multimode cavity, with two or more modes being simultaneously supported by the cavity.

The total optical thickness L of a cavity of the type shown in FIGS. 1 and 2 is given by the following expression:

$$L = (\lambda/2)(n_{eff}/\Delta n) + \sum_i n_i L_i + (\phi_m \lambda/4\pi) \qquad (1)$$

The first term in expression (1) is due to the effective penetration depth in the multilayer reflector, the second term is the sum of the optical thicknesses of the layers in the cavity, and the last term, usually small in comparison with the other two, is due to the phase shift at the top mirror. Parameter $\lambda$ is the relevant wavelength, $n_{eff}$ is the effective refractive index of the multilayer reflector, $\Delta n$ is the index difference between the two materials that make up the multilayer reflector, $n_i$ and $L_i$ are the refractive index and actual thickness of the i'th layer in the cavity, and $\phi_m$ is the phase shift at the top mirror. The phase shift is given by $$\phi_m = \arctan[(2n_s k_m) \cdot (n_s^2 - n_m^2 - k_m^2)^{-1}], \qquad (2)$$

where $n_s$ is the refractive index of the material that is in contact with the top mirror, and $n_m$ and $k_m$ are the real and imaginary parts of the refractive index of the top mirror material.

It will be apparent that a display according to the invention can comprise microcavity emitters of more than one optical thickness. Indeed, it is possible to combine in one display one or more multimode emitters as described herein with one or more single mode emitters.

In a display that is to comprise multimode microcavity emitters of optical thickness L and L' it is frequently advantageous to vary the thickness of the filler layer while keeping all other thicknesses constant. Of course, at least in principle, the same effect can be achieved by changing the thickness of any of the other layers in the cavity, e.g., of the transparent conductor layer 13, of the optional hole transport layer 14, or of the EL layer 15, and all these possibilities are contemplated. However, for manufacturability reasons we currently prefer provision and selective thinning of an appropriate filler layer, since the latter operation is typically currently more readily controllable with filler materials such as polyimide or $SiO_2$ than it is with other layer materials, e.g. ITO, Alq or diamine.

Figure 4:
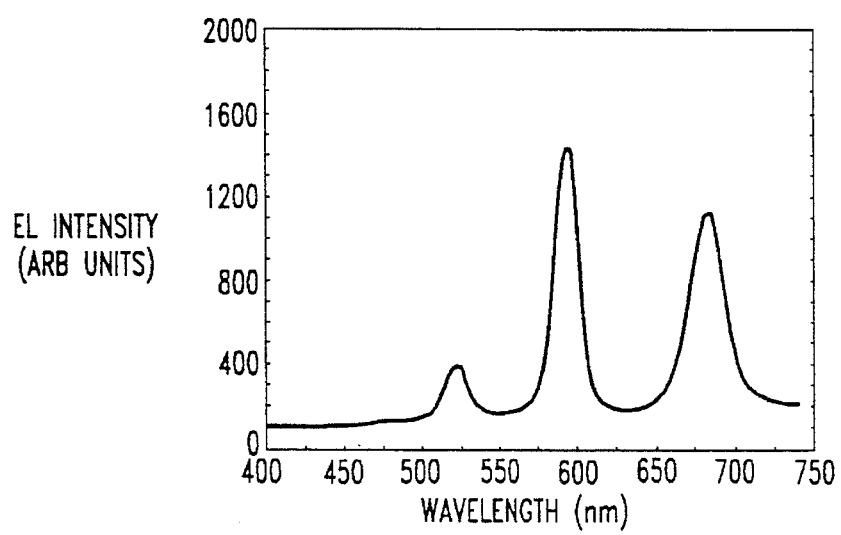
FIGS. 4–6 each show the emission spectrum of an exemplary multimode microcavity emitter.
Figure 5:
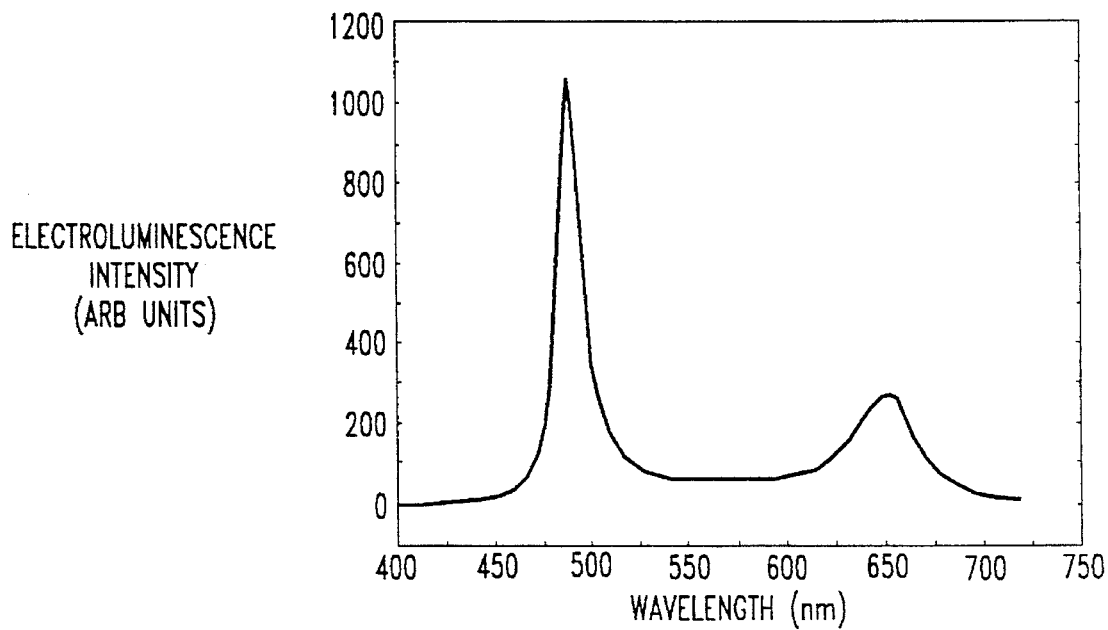

FIGS. 4 and 5 each show the emission spectrum of an exemplary multimode microcavity according to the invention. The emitter that yielded the spectrum of FIG. 4 was a bottom emitting device similar to the device of FIG. 1, and comprised, on a glass substrate, a quarter wave $SiO_2/Si_xN_y$ (92/62 nm) stack, a 835 nm silicon nitride filler layer, a 11.5 nm Au hole injection contact layer, a 100 nm tri-phenyl diamine hole transport layer, a 70 nm Alq EL layer, and a patterned Al electron injection contact and top mirror. The total effective cavity length of this structure was about 2.5 µm. As can be readily seen from FIG. 4, the emission spectrum of the described structure has three well defined peaks, with relatively little intensity outside of the peaks. The apparent color of the emission was orange-red.

FIG. 5 shows the emission spectrum of another exemplary multimode emitter. The structure was substantially as described above, except that the filler layer thickness was about 40 nm, the hole injection contact layer was 55 nm ITO, and the Alq EL layer thickness was 30 nm. The apparent color of the emission was white.

Figure 7:
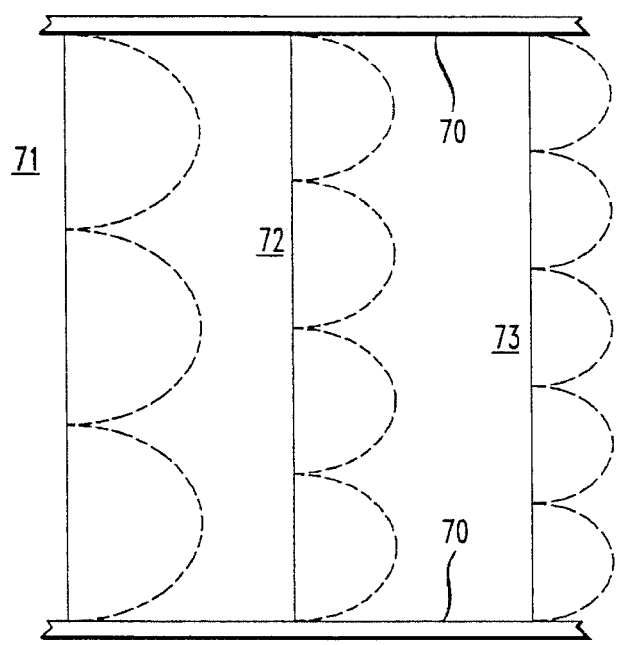
FIG. 7 schematically depicts a cavity with three standing wave modes.

The emission spectrum (and thus the apparent color) of the multimode microcavity emitter can be changed by changing the optical length of the cavity. This, however, is not the only way to control the apparent color. For instance, the apparent color can also be changed by changing the position of the re-combination region of the device (exemplarily the Alq/diamine interface) with respect to the nodes/antinodes of the modes supported by the cavity. FIG. 7 schematically depicts an exemplary standing wave intensity pattern in a multimode cavity defined by reflectors 70. Intensity patterns 71–73 represent a third, fourth and fifth order mode, respectively.

Figure 6:
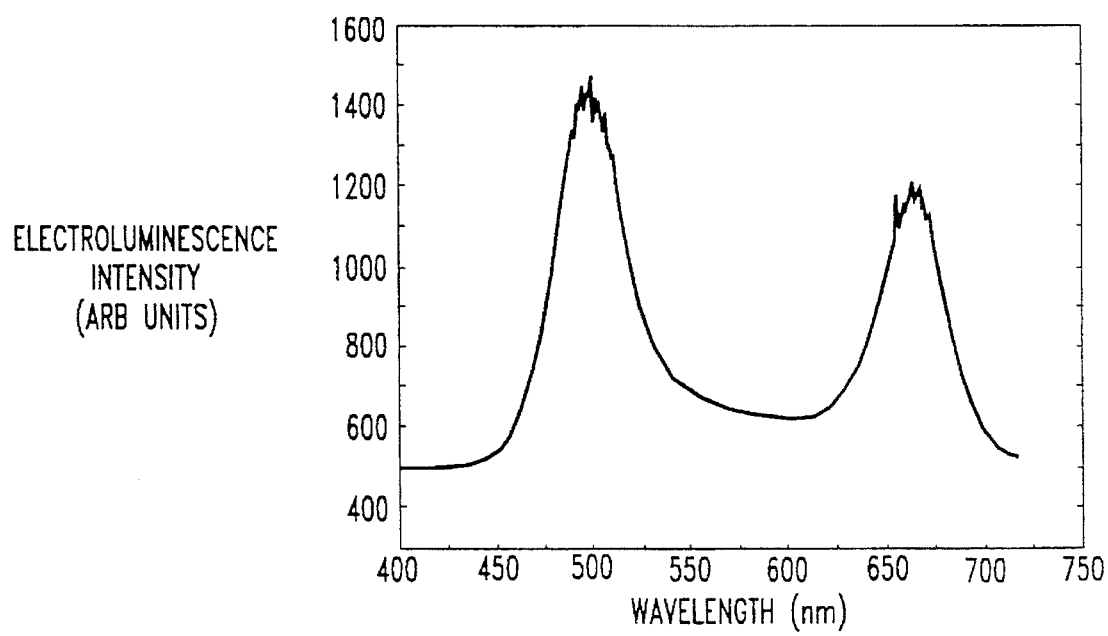

For instance, a particular spectral peak will be relatively intense if the mode that corresponds to the peak has an antinode in the re-combination region. Conversely, by selecting the device parameters such that a node of the standing wave pattern of the radiation associated with a particular spectral peak lies in the recombination region, the amplitude of the peak can be relatively weak. For instance, changing, in the structure that yielded the spectrum of FIG. 5, the EL layer thickness to 70 nm resulted in the spectrum of FIG. 6, with substantially reduced height of the lower wavelength peak relative to the higher wavelength peak.

A theoretical formula that describes the effect of the location of the emitting dipoles in a III/V semiconductor multilayer structure on the emission spectrum was recently published (Eqn. 7 of D. G. Deppe et at., *J. of Modern Optics*, Vol. 41(2), p. 325; the article is incorporated herein by reference.) The same equation can be applied to the instant organic-based emitter structures.

Although it is not a currently preferred approach, it may also be possible to provide external color filters to tailor the emission spectrum to result in a desired apparent color, or to use multimode microcavities to obtain emission wavelengths which match a predetermined filter set. All such variations of the inventive structure are contemplated.

We claim:

1. An article comprising a layer structure on a major surface of a substrate body, said layer structure comprising
   a) spaced apart first and second reflectors defining a microcavity of effective optical length L;
   b) an active layer that comprises organic material capable of electroluminescence, and having an electroluminescence spectrum including an emission region, with at least a portion of the active layer disposed between said reflector means; and
   c) electrodes that facilitate flowing a current through the at least portion of the active layer such that the microcavity can be caused to emit radiation;

CHARACTERIZED IN THAT d) the effective optical length L is selected such that the microcavity is a multimode cavity that simultaneously supports at least two modes of radiation, each of said modes having a wavelength within said emission region of said electroluminescence spectrum, such that the microcavity can simultaneously emit radiation of at least two predetermined colors.

2. Article according to claim 1, wherein the layer structure further comprises
   i) an electron transport layer; or
   ii) a hole transport layer; or
   iii) a hole transport layer and an electron transport layer.

3. Article according to claim 1, wherein at least one of said reflectors comprises a multilayer dielectric mirror.

4. Article according to claim 1, wherein the layer structure further comprises a filler layer disposed between the reflectors.

5. Article according to claim 1, wherein the layer structure further comprises a scattering layer disposed outside the microcavity.

6. Article according to claim 1, wherein L is selected such that at least one of said two modes is a third order or higher standing wave mode of the microcavity.

7. Article according to claim 1, wherein the article comprises a multiplicity of microcavities of effective optical length L.

8. Article according to claim 7, the article further comprising a multiplicity of microcavities of effective optical length L'≠L.

9. Article according to claim 8, wherein L' is selected such that the microcavities of effective optical length L' are multimode microcavities.

10. Article according to claim 6, wherein associated with the layer structure is a re-combination region, and wherein the layer structure is selected such that at least one of said standing wave modes has a node or an antinode substantially in the re-combination region.

11. Article according to claim 1, wherein the organic material capable of electroluminescence comprises a substantially non-emissive host organic material doped with an emissive organic dopant material.

12. Article according to claim 1, comprising a gold electrode.

13. Article according to claim 1, comprising an electrode comprising a metal selected from Al, In, Mg, Ca, and alloys thereof.

14. Article according to claim 13, wherein said electrode comprises two or more metal layers.

15. Article according to claim 1, wherein the article is a flat panel display, apparatus comprising optical interconnects, optical fiber communication apparatus, or LED printing apparatus.

16. Article according to claim 3, wherein one of said reflectors is a portion of a patterned metal layer.

17. Article according to claim 1, wherein the substrate body comprises a glass body having two major surfaces.

18. Article of claim 17, wherein at least one major surface of the glass body is coated with a coating material having a refractive index higher than the refractive index of the glass body.

19. Article of claim 18, wherein said coating material is $TiO_2$.

20. Article according to claim 16, wherein the organic material capable of electroluminescence is selected from the group consisting of Alq, aromatic hydrocarbons, poly(phenylene vinylenes), oxadiazole or stilbene derivatives, and any of the foregoing doped with a dopant selected from the group consisting of coumarins and 4-(dicyanomethylene)-4H-pyrans; wherein the multilayer dielectric mirror comprises alternating layers of $SiO_2$ and silicon nitride, or $SiO_2$ and $TiO_2$; wherein the patterned metal layer comprises material selected from Al, In, Mg, Ca, and alloys thereof; and wherein said electrodes for applying an electric field across said at least portion of the active layer comprise indium tin oxide or doped polyaniline.

21. An article according to claim 1, wherein the layer structure is selected such that said at least two colors provide an apparent color that is white.

* * * * *